(12) United States Patent
Hung et al.

(10) Patent No.: US 9,947,753 B2
(45) Date of Patent: Apr. 17, 2018

(54) SEMICONDUCTOR STRUCTURE AND MANUFACTURING METHOD THEREOF

(71) Applicant: TAIWAN SEMICONDUCTOR MANUFACTURING CO., LTD., Hsinchu (TW)

(72) Inventors: Chi-Cheng Hung, Tainan (TW); Kei-Wei Chen, Tainan (TW); Yu-Sheng Wang, Tainan (TW); Ming-Ching Chung, Tainan (TW); Chia-Yang Wu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/842,680

(22) Filed: Sep. 1, 2015

(65) Prior Publication Data

US 2016/0336412 A1 Nov. 17, 2016

Related U.S. Application Data

(60) Provisional application No. 62/162,388, filed on May 15, 2015.

(51) Int. Cl.

| *H01L 29/417* | (2006.01) |
| *H01L 29/66* | (2006.01) |
| *H01L 29/78* | (2006.01) |
| *H01L 21/768* | (2006.01) |
| *H01L 29/08* | (2006.01) |

(Continued)

(52) U.S. Cl.
CPC .. *H01L 29/41725* (2013.01); *H01L 21/28518* (2013.01); *H01L 21/76805* (2013.01); *H01L 21/76831* (2013.01); *H01L 23/485* (2013.01); *H01L 29/0847* (2013.01); *H01L 29/165* (2013.01); *H01L 29/66545* (2013.01); *H01L 29/66636* (2013.01); *H01L 29/7834* (2013.01); *H01L 29/7848* (2013.01);

(Continued)

(58) Field of Classification Search
CPC .................... H01L 29/41725; H01L 21/76802
USPC .......................................... 257/417; 438/666
See application file for complete search history.

(56) References Cited

U.S. PATENT DOCUMENTS 5,747,384 A * 5/1998 Miyamoto ........ H01L 21/28512
257/E21.165
8,624,350 B2 1/2014 Kim et al.
(Continued)

FOREIGN PATENT DOCUMENTS

KR 10-2013-0024685 A 3/2013
KR 10-2013-0033262 A 4/2013
(Continued)

*Primary Examiner* — Moazzam Hossain
(74) *Attorney, Agent, or Firm* — Maschoff Brennan

(57) ABSTRACT

A semiconductor structure includes a semiconductor substrate, at least one dielectric layer, a dielectric spacer liner (DSL) layer, and at least one conductor. The dielectric layer is present on the semiconductor substrate. The dielectric layer has at least one contact hole exposing at least a portion of the semiconductor substrate. The semiconductor substrate has at least one recess communicating with the contact hole. The recess has a bottom surface and at least one sidewall. The DSL layer is present on at least the sidewall of the recess. The conductor is present at least partially in the contact hole and is electrically connected to the semiconductor substrate.

15 Claims, 15 Drawing Sheets

(51) Int. Cl.
  *H01L 29/165* (2006.01)
  *H01L 21/285* (2006.01)
  *H01L 23/485* (2006.01)
  *H01L 29/49* (2006.01)

(52) U.S. Cl.
  CPC .. *H01L 21/76843* (2013.01); *H01L 21/76855* (2013.01); *H01L 29/4966* (2013.01)

(56) References Cited

U.S. PATENT DOCUMENTS

| | | | |
|---|---|---|---|
| 9,111,907 B2* | 8/2015 | Kamineni | H01L 29/41791 257/289 |
| 2011/0272765 A1* | 11/2011 | Seo | H01L 23/485 257/410 |
| 2013/0049219 A1 | 2/2013 | Tsai et al. | |
| 2013/0075831 A1 | 3/2013 | JangJian et al. | |
| 2013/0316509 A1* | 11/2013 | Qin | H01L 29/6653 438/289 |
| 2014/0167181 A1* | 6/2014 | Xiong | H01L 27/0629 257/379 |
| 2014/0206190 A1* | 7/2014 | Li | H01L 29/401 438/683 |
| 2015/0061024 A1 | 3/2015 | Li et al. | |
| 2015/0187755 A1* | 7/2015 | Mehrotra | H01L 29/7378 257/192 |
| 2015/0243544 A1* | 8/2015 | Alptekin | H01L 21/7682 438/586 |
| 2016/0071799 A1* | 3/2016 | Hsieh | H01L 29/16 257/288 |

FOREIGN PATENT DOCUMENTS

| | | |
|---|---|---|
| KR | 10-2015-0026712 A | 3/2015 |
| TW | 201106445 A1 | 2/2011 |

* cited by examiner

SEMICONDUCTOR STRUCTURE AND MANUFACTURING METHOD THEREOF

PRIORITY CLAIM AND CROSS-REFERENCE

This application claims priority to U.S. Provisional Application Ser. No. 62/162,388, filed May 15, 2015, which is herein incorporated by reference.

BACKGROUND

The present disclosure relates to semiconductor devices.

The scaling of integrated circuits is a constant effort. With circuits becoming smaller and faster, metal silicide contacts are often used to obtain higher circuit performance. Since the metal silicide contacts have lower contact resistance than non-silicided regions, integrated circuits using this technology can have smaller contact areas, and use less energy to pass electricity through them. Together, these effects lead to higher-performance integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
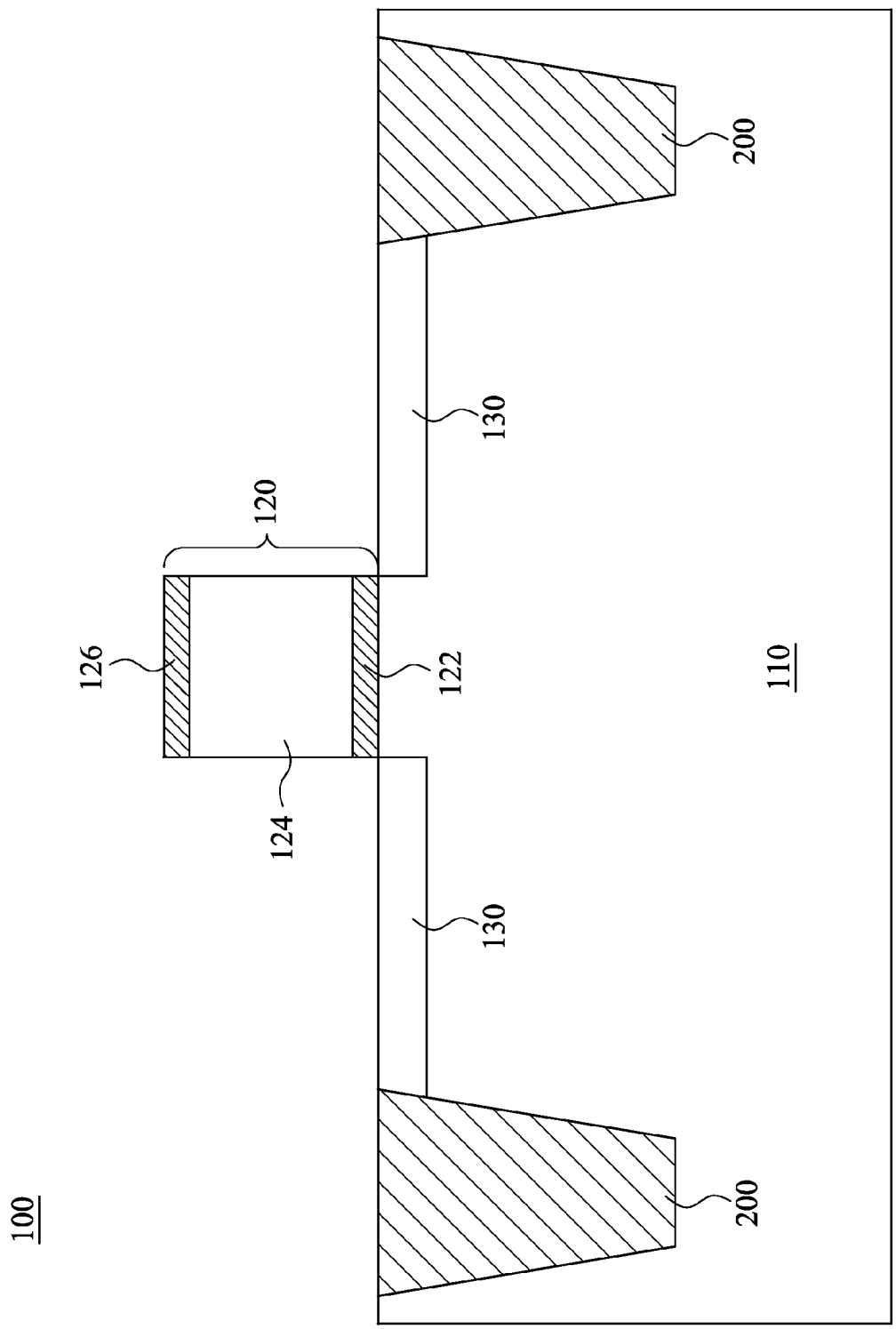
FIGS. 1-15 are cross-sectional views of intermediate stages in formation of a metal-oxide-semiconductor (MOS) device in accordance with some exemplary embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-oxide-semiconductor (MOS) device and a method for manufacturing the same are provided in accordance with various exemplary embodiments. The intermediate stages of forming the MOS device are illustrated. The variations of the embodiments are discussed. Throughout the various views and illustrative embodiments, like reference numbers are used to designate like elements.

FIGS. 1-15 are cross-sectional views of intermediate stages in formation of a metal-oxide-semiconductor (MOS) device 100 in accordance with some exemplary embodiments. Reference is made to FIG. 1. A wafer, which includes a semiconductor substrate 110, is provided. The semiconductor substrate 110 may be made of a semiconductor material, such as silicon, silicon carbide (SiC), silicon germanium (SiGe), an III-V compound semiconductor, or combinations thereof. Isolation regions, such as shallow trench isolation (STI) regions 200, are formed in the semiconductor substrate 110 and are used to define the active region of the MOS device 100.

A gate stack 120 is formed over the semiconductor substrate 110. The gate stack 120 includes a dummy gate dielectric 122 and a dummy gate electrode 124. The dummy gate dielectric 122 includes silicon oxide in some exemplary embodiments. In alternative embodiments, other materials, such as silicon nitride, silicon carbide (SiC), and the like, are also used. The dummy gate electrode 124 may include polysilicon. In some embodiments, the gate stack 120 further includes a hard mask 126 over the dummy gate electrode 124. The hard mask 126 may include silicon nitride, for example, while other materials, such as silicon carbide (SiC), silicon oxynitride, and the like, may also be used. In alternative embodiments, the hard mask 126 is not formed.

Lightly-doped drain/source (LDD) regions 130 are formed, for example, by implanting a p-type impurity (such as boron and/or indium) or an n-type impurity (such as phosphorous and/or arsenic) into the semiconductor substrate 110, depending on the conductivity type of the resulting metal-oxide-semiconductor (MOS) device 100. For example, when the MOS device 100 is a pMOS device, the LDD regions 130 are p-type regions. When the MOS device 100 is an nMOS device, the LDD regions 130 are n-type regions. The gate stack 120 acts as an implantation mask, so that the edges of the LDD regions 130 are substantially aligned with the edges of the gate stacks 120.

Figure 2:
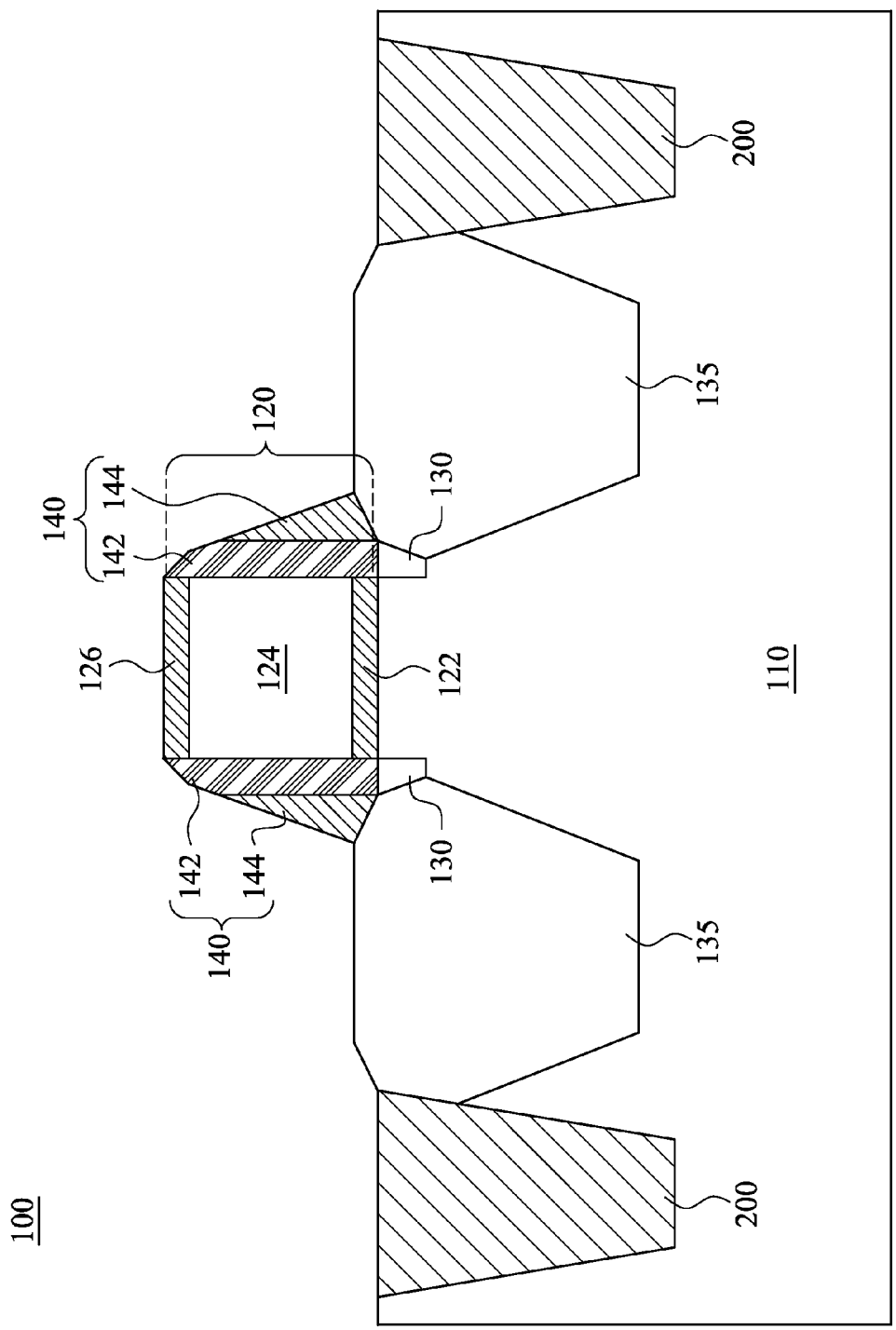

Reference is made to FIG. 2. Gate spacers 140 are formed on sidewalls of the gate stack 120. In some embodiments, each of the gate spacers 140 includes a silicon oxynitride layer 142 and a silicon oxide layer 144. In alternative embodiments, the gate spacers 140 include one or more layers, each including silicon oxide, silicon nitride, silicon oxynitride, or other dielectric materials. The available formation methods include plasma enhanced chemical vapor deposition (PECVD), low-pressure chemical vapor deposition (LPCVD), sub-atmospheric chemical vapor deposition (SACVD), and other deposition methods.

Source and drain regions (referred to as source/drain regions hereinafter) 135 are formed in the semiconductor substrate 110. In the embodiments wherein the metal-oxide-semiconductor (MOS) device 100 is a pMOS device, the source/drain regions 135 are of p-type. In the embodiments wherein the MOS device 100 is an nMOS device, the source/drain regions 135 are of n-type. In some embodiments, source/drain stressors (also marked as 135) are formed in the semiconductor substrate 110. The source/drain stressors form at least parts of the source/drain regions 135. FIG. 2 illustrates the embodiments in which the source/drain regions 135 fully overlap the respective source/drain stressors. In alternative embodiments, the source/drain regions 135 and the source/drain stressors are partially overlapped.

Furthermore, in the embodiments in which the metal-oxide-semiconductor (MOS) device 100 is an nMOS device, the source/drain stressors 135 may include silicon phosphorous (SiP), silicon carbide (SiC), or the like. In the embodiments in which the MOS device 100 is a pMOS device, the source/drain stressors 135 may include silicon germanium (SiGe). The formation of the source/drain stressors 135 may be achieved by etching the semiconductor substrate 110 to form recesses therein and then performing an epitaxy to grow the source/drain stressors 135 in the recesses.

Figure 3:
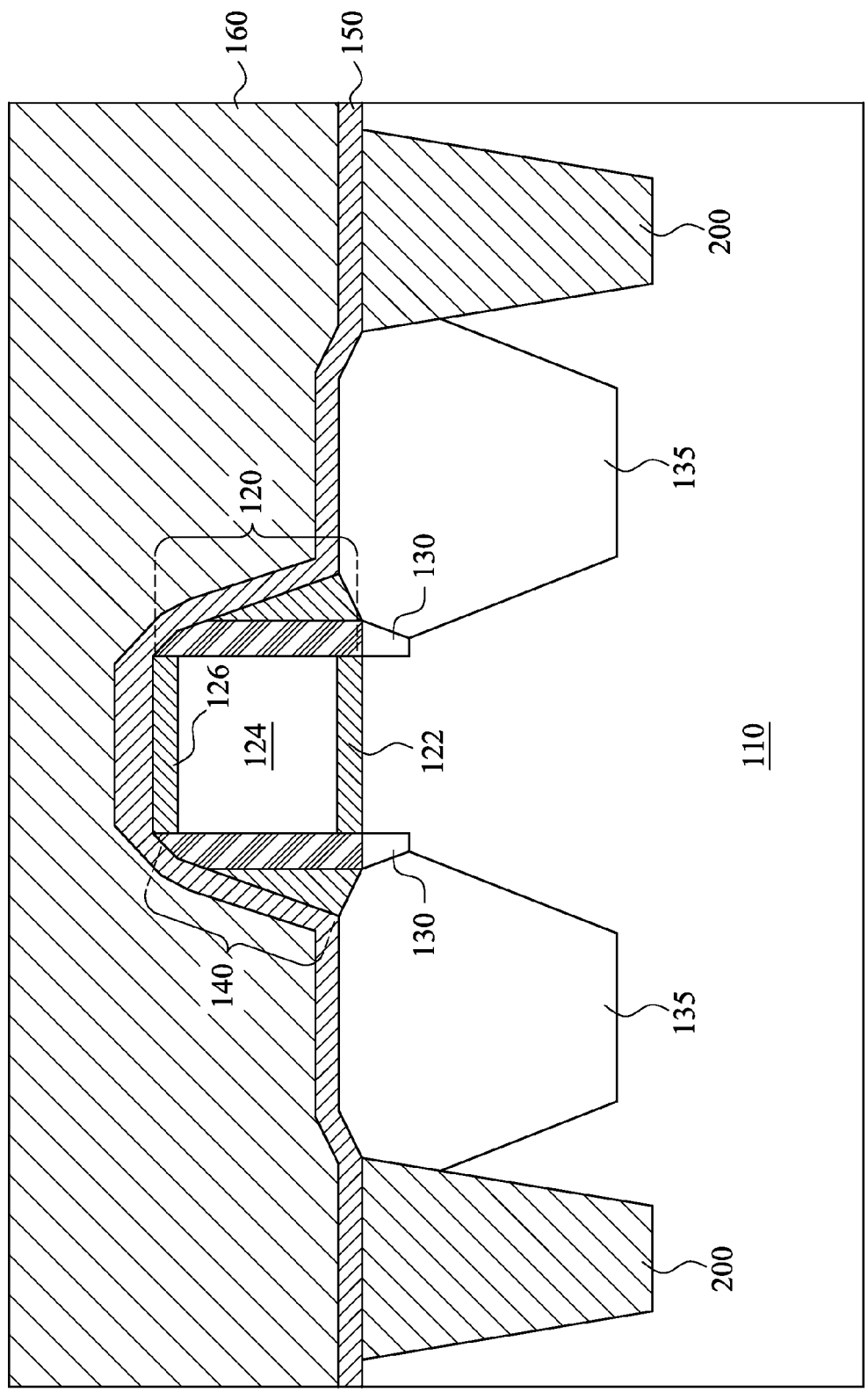

Reference is made to FIG. 3. A contact etch stop layer (CESL) 150 is formed over the gate stack 120 and the source/drain regions 135. In some embodiments, the CESL 150 includes silicon nitride, silicon carbide (SiC), or other dielectric materials. An inter-layer dielectric (ILD) 160 is form over the CESL 150. The ILD 160 is blanket formed to a height higher than a top surface of the gate stack 120. The ILD 160 may include flowable oxide formed using, for example, flowable chemical vapor deposition (FCVD). The ILD 160 may also be a spin-on glass formed using spin-on coating. For example, the ILD 160 may include phospho-silicate glass (PSG), boro-silicate glass (BSG), boron-doped phospho-silicate glass (BPSG), tetraethyl orthosilicate (TEOS) oxide, TiN, SiOC, or other low-k non-porous dielectric materials.

Figure 4:
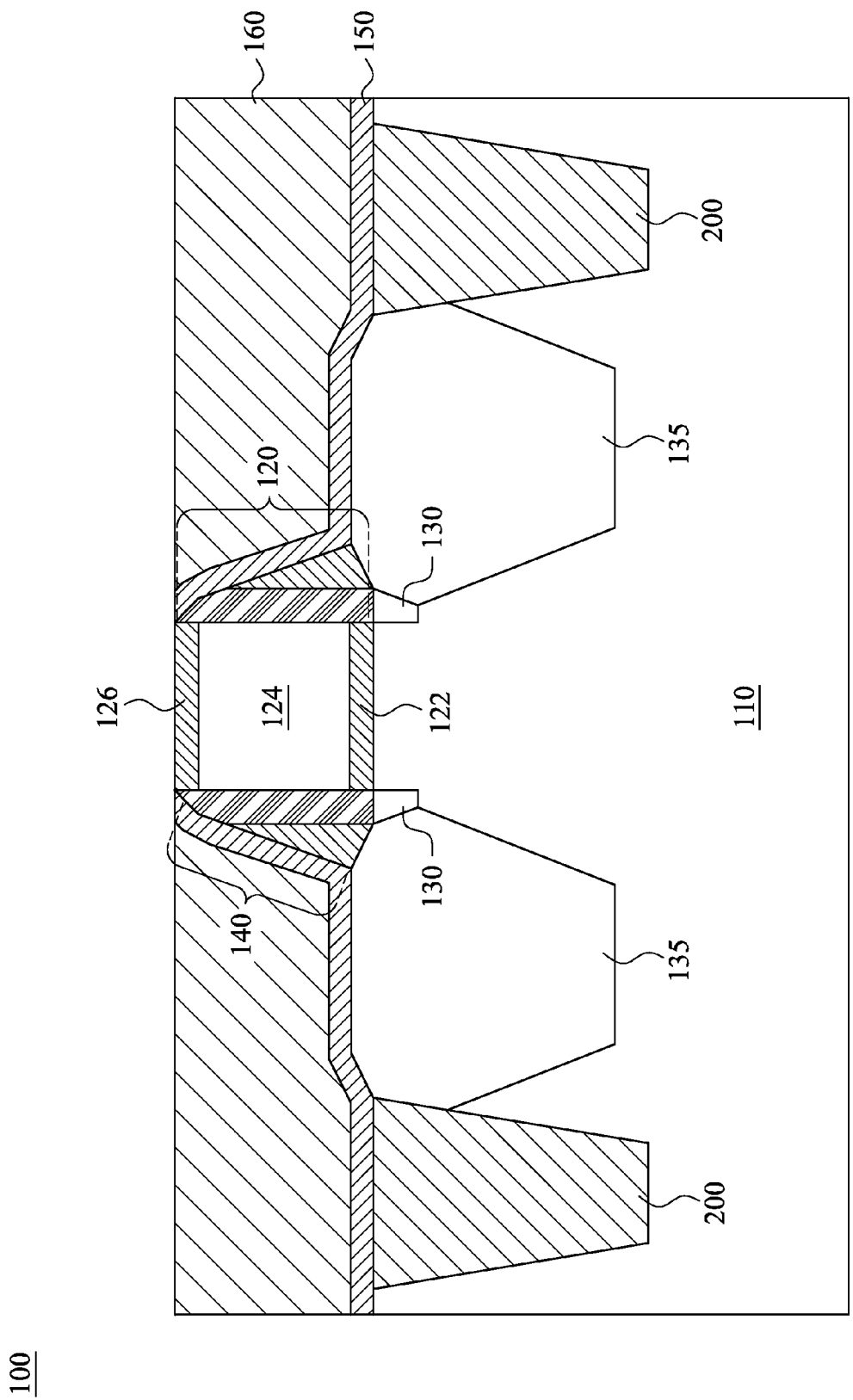

FIG. 4 illustrates a planarization step, which is performed using, for example, chemical mechanical polish (CMP). The CMP is performed to remove excess portions of the inter-layer dielectric (ILD) 160 and the contact etch stop layer (CESL) 150, wherein the excess portions are over the top surface of the hard mask 126. Accordingly, the gate stack 120 is exposed. In alternative embodiments, the hard mask 126 is removed during the CMP, wherein the CMP stops on the top surface of the dummy gate electrode 124.

Figure 5:
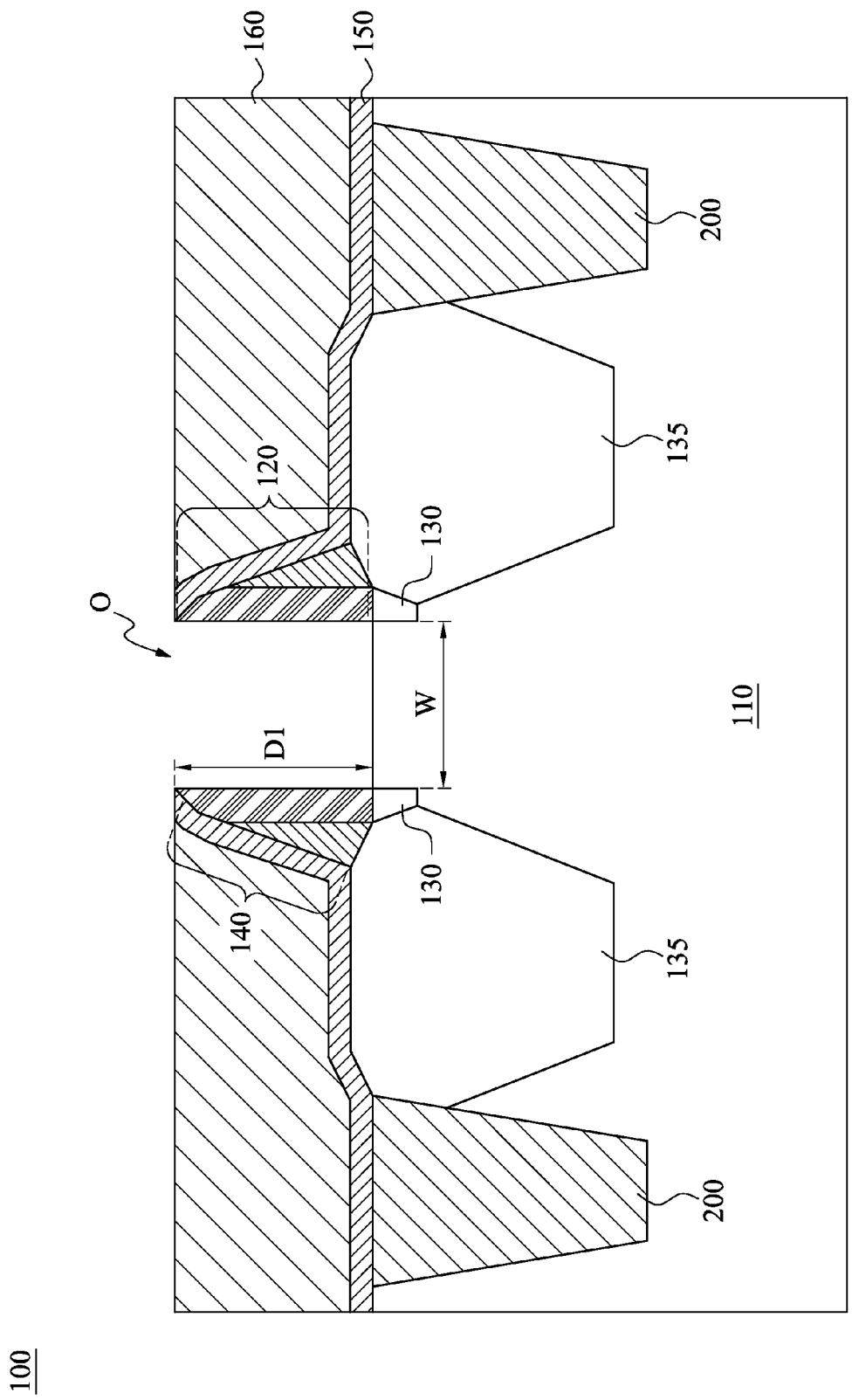

Reference is made to FIG. 5. The hard mask 126, the dummy gate electrode 124, and the dummy gate dielectric 122 are removed. An opening O is formed as a result of the removal of the hard mask 126, the dummy gate electrode 124, and the dummy gate dielectric 122. In some embodiment, the width W1 of the opening O is smaller than about 25 nm and may be in a range from about 18 nm to about 22 nm. It is appreciated, however, that the values recited throughout the description are merely examples and may be changed to different values. Furthermore, the depth D1 of the opening O may be greater than about 40 nm. The aspect ratio D1/W1 of the opening O may be higher than about 1.3, higher than about 7, or higher than about 10.

Figure 6:
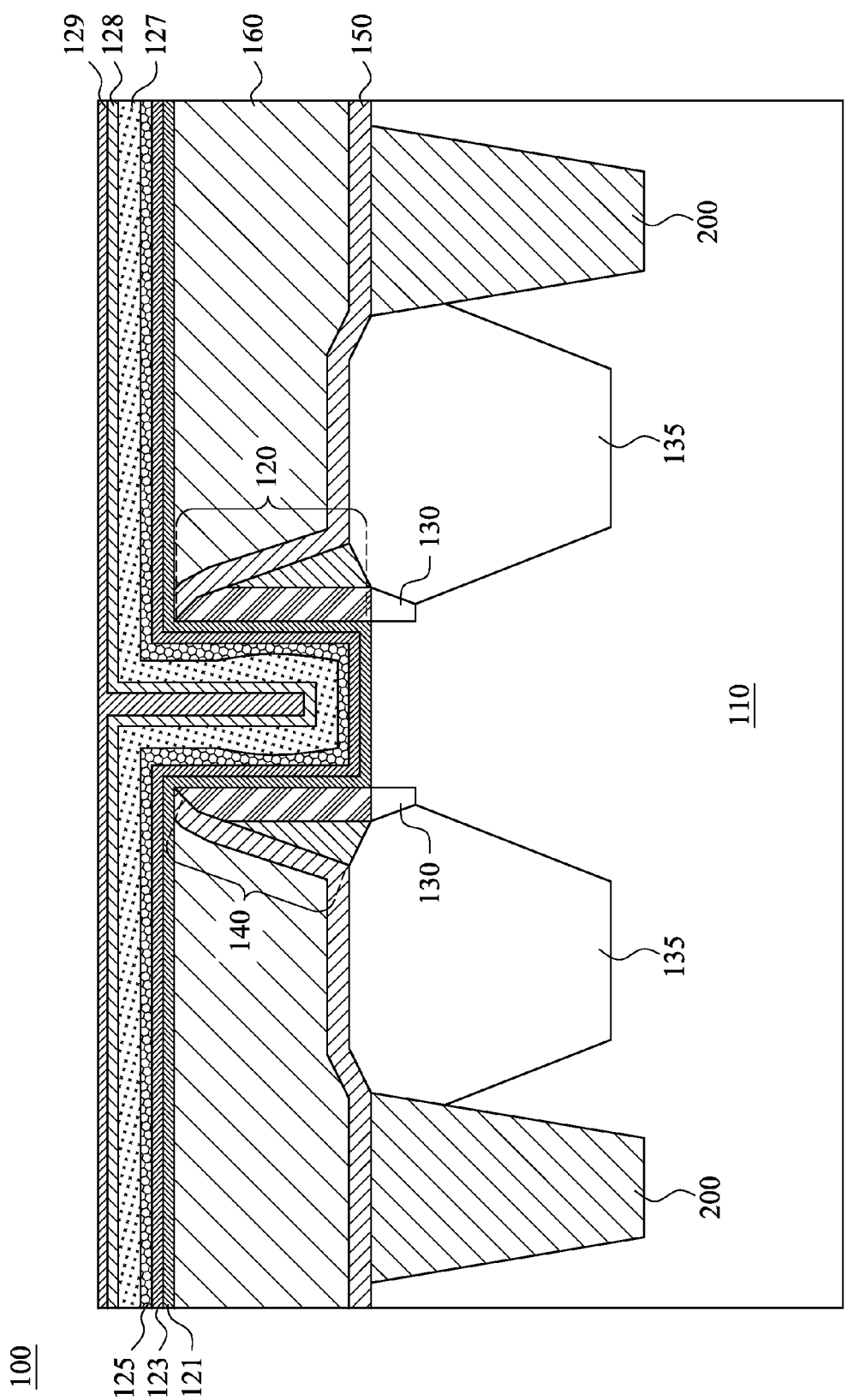

Reference is FIG. 6. A gate dielectric layer 121 is formed. In some embodiments, the gate dielectric layer 121 includes an interfacial layer (IL, the lower part of the gate dielectric layer 121), which is a dielectric layer. In some embodiments, the IL includes an oxide layer, such as a silicon oxide layer, which may be formed through a thermal oxidation of the semiconductor substrate 110, a chemical oxidation, or a deposition step. The gate dielectric layer 121 may also include a high-k dielectric layer (the upper part of the gate dielectric layer 121) including a high-k dielectric material, such as hafnium oxide, lanthanum oxide, aluminum oxide, or combinations thereof. The dielectric constant (k-value) of the high-k dielectric material is higher than about 3.9, and may be higher than about 7, and sometimes as high as about 21 or higher. The high-k dielectric layer is overlying, and may contact, the IL.

As shown in FIG. 6, a diffusion barrier layer 123 is formed over the gate dielectric layer 121. In some embodiments, the diffusion barrier layer 123 includes TiN, TaN, or combinations thereof. For example, the diffusion barrier layer 123 may include a TiN layer (the lower part of the diffusion barrier layer 123), and a TaN layer (the upper part of the diffusion barrier layer 123) over the TiN layer. The TiN layer may have a thickness lower than about 65 Å, and the TaN layer may have a thickness lower than about 20 Å.

A metal layer 125 is formed over the diffusion barrier layer 123. In the embodiments in which the resulting metal-oxide-semiconductor (MOS) device 100 is an nMOS device, the metal layer 125 is in contact with the diffusion barrier layer 123. For example, in the embodiments in which the diffusion barrier layer 123 includes a TiN layer and a TaN layer, the metal layer 125 may be in physical contact with the TaN layer. In alternative embodiments in which the resulting MOS device 100 is a pMOS device, an additional TiN layer (not shown) is formed between, and in contact with, the TaN layer (in the diffusion barrier layer 123) and the overlaying metal layer 125. The additional TiN layer provides the work function suitable for the pMOS device, which work function is higher than the mid-gap work function (about 4.5 eV) that is in the middle of the valance band and the conduction band of silicon. The work function higher than the mid-gap work function is referred to as a p-work function, and the respective metal having the p-work function is referred to as a p-metal.

The metal layer 125 provides the work function suitable for the nMOS device, which work function is lower than the mid-gap work function. The work function lower than the mid-gap work function is referred to as an n-work function, and the respective metal having the n-work function may be referred to as an n-metal. In some embodiments, the metal layer 125 is an n-metal having a work function lower than about 4.3 eV. The work function of the metal layer 125 may also be in a range from about 3.8 eV to about 4.6 eV. The metal layer 125 may include titanium aluminum (TiAl) (which may include, or free from or substantially free from other elements) in accordance with some embodiments. The formation of the metal layer 125 may be achieved through physical vapor deposition (PVD). In accordance with some embodiments of the present disclosure, the metal layer 125 is formed at room temperature (for example, from about 20° C. to about 25° C.). In alternative embodiments, the metal layer 125 is formed at an elevated temperature higher than the room temperature, for example, higher than about 200° C.

A block layer 127 is formed over the metal layer 125. The block layer 127 may include TiN in some embodiments. The block layer 127 may be formed using atomic layer deposition (ALD). In some embodiments, the block layer 127 has a thickness in a range from about 2 nm to about 7 nm.

A wetting layer 128 which has an ability to adhere (and wet) the subsequently formed filling metal 129 during the reflow of the filling metal 129 is formed over the block layer 127. In some embodiments, the wetting layer 128 is a cobalt layer, which may be formed using atomic layer deposition (ALD) or chemical vapor deposition (CVD). In some embodiments, the wetting layer 128 has a thickness in a range from about 1 nm to about 3 nm.

Filling metal 129 is formed to fill the remaining portion of the opening O (as shown in FIG. 5). The filling metal 129 may include aluminum or an aluminum alloy, which may also be formed using physical vapor deposition (PVD), chemical vapor deposition (CVD), or the like. The filling metal 129 may be reflowed to fully fill the remaining opening O as in FIG. 5. The formation of the wetting layer 128 improves the wetting of the filling metal 129 to the underlying layers.

Figure 7:
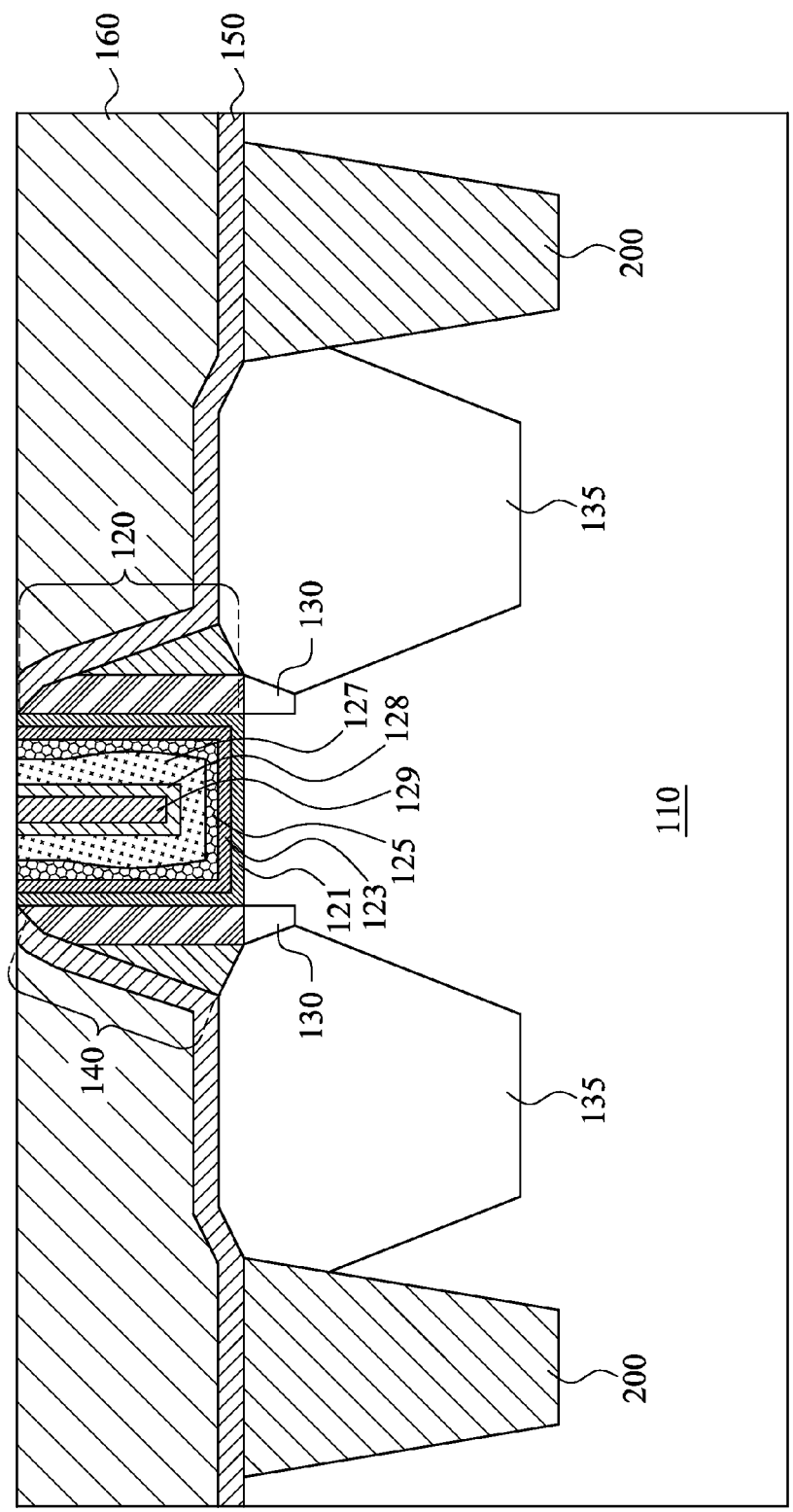

FIG. 7 illustrates a planarization step (for example, chemical mechanical polish (CMP)) for removing excess portions of the layers 129, 128, 127, 125, 123, and 121, wherein the excess portions are over the inter-layer dielectric (ILD) 160. The remaining portions of the layers 129, 128, 127, 125, 123, and 121 form a replacement metal-containing gate stack. Each of the remaining portions of the layers 129, 128, 127, 125, 123, and 121 may include a bottom portion and sidewall portions over and connected to the bottom portion.

Figure 8:
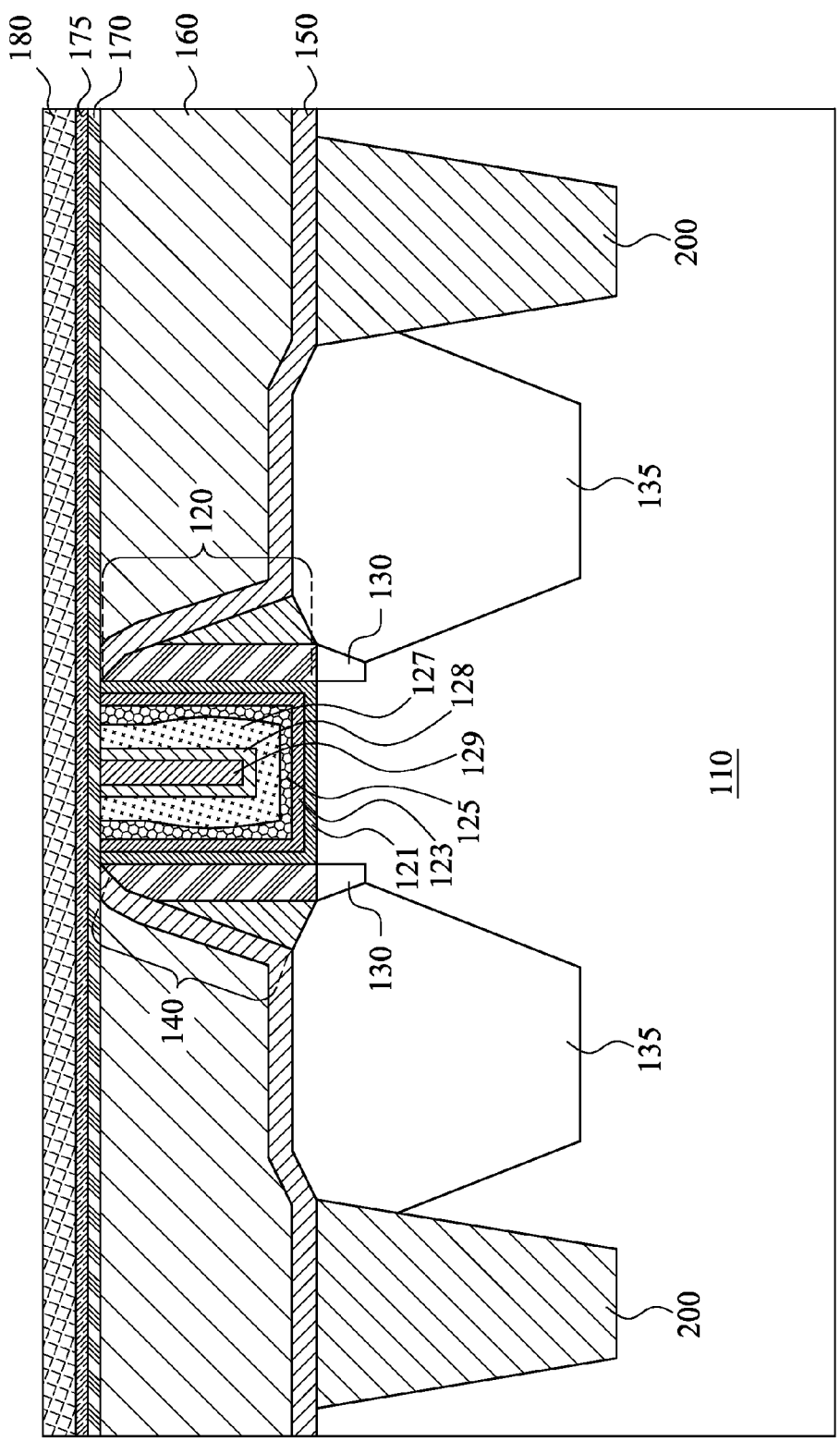

Reference is made to FIG. 8. An oxide film 170 is formed on the inter-layer dielectric (ILD) 160 and the gate stack 120, in accordance with some embodiments. The oxide film 170 is a continuous film. The oxide film 170 may cover or be in direct contact with the ILD 160 and the gate stack 120. The oxide film 170 is made of, for example, silicon oxide, aluminum oxide, or other oxide-containing materials suitable to adhere to the ILD 160 and the subsequently formed layer. The oxide film 170 may have a thickness in a range from about 10 Å to about 30 Å. The oxide film 170 may be formed using, for example, chemical vapor deposition (CVD).

A contact etch stop layer (CESL) 175 is formed over the inter-layer dielectric (ILD) 160 and the gate stack 120 in accordance with some embodiments. The CESL 175 may be formed on the oxide film 170. The CESL 175 is made of silicon nitride or other suitable materials.

Embodiments of the disclosure have many variations. For example, in alternative embodiments, the oxide film 170 is not formed. The gate stack 120 is in direct contact with the contact etch stop layer (CESL) 175.

A protective layer 180 is formed on the contact etch stop layer (CESL) 175. The protective layer 180 is configured to protect the CESL 175 from being damaged during a subsequent pre-amorphized implantation (PAI) process, in accordance with some embodiments. The protective layer 180 includes, for example, a plasma-enhanced oxide (PEOX) layer.

Figure 9:
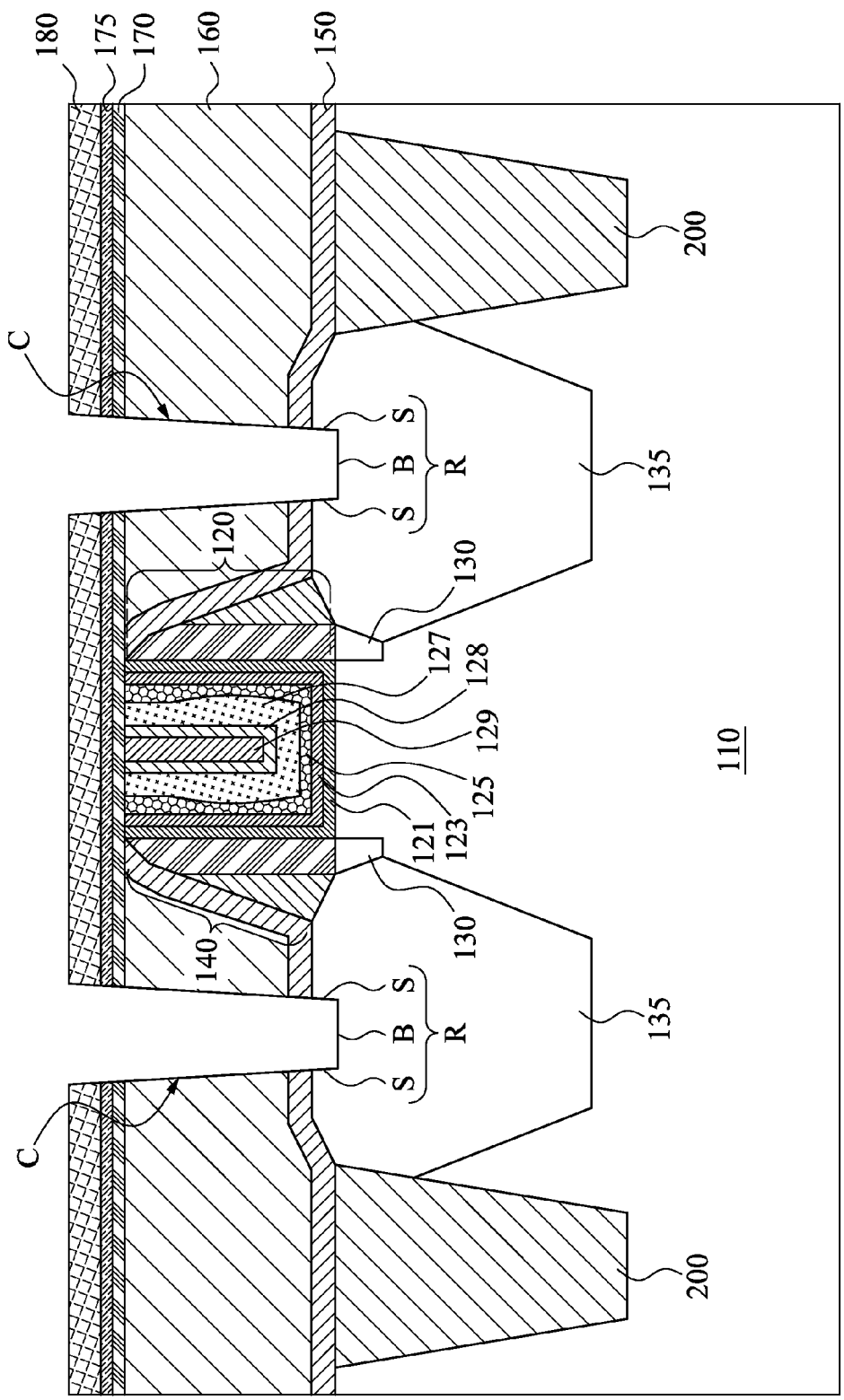

Reference is made to FIG. 9. The protective layer 180, the contact etch stop layer (CESL) 175, the oxide film 170, the inter-layer dielectric (ILD) 160, and the contact etch stop layer (CESL) 150 may be patterned to form contact holes C exposing the source/drain regions 135, respectively. A photolithography process and an etching process may be used for patterning. For example, a photoresist etch mask can be produced by applying a photoresist layer to the upper surface of the protective layer 180, exposing the photoresist layer to a pattern of radiation, and then developing the pattern into the photoresist etch mask utilizing a resist developer. The photoresist etch mask may be positioned so that portions of the protective layer 180, the CESL 175, the oxide film 170, the ILD 160, and the CESL 150 are not protected by the photoresist etch mask in order to provide the contact holes C.

The exposed portions of the protective layer 180, the contact etch stop layer (CESL) 175, the oxide film 170, the inter-layer dielectric (ILD) 160, and the contact etch stop layer (CESL) 150 are then removed to form the contact holes C. In some embodiments, portions of the source/drain regions 135 are removed as well to form recesses R respectively in the source/drain regions 135. The recesses R respectively communicate with the contact holes C.

In some embodiments, the contact holes C and the recesses R are formed using a combination of dry etching and wet etching. Specifically, the exposed portions of the protective layer 180, the contact etch stop layer (CESL) 175, the oxide film 170, the inter-layer dielectric (ILD) 160, and the contact etch stop layer (CESL) 150 may be removed to form the contact holes C using dry etching, such as reactive ion etching (RIE). Then, portions of the source/drain regions 135 may be removed to form the recesses R using wet etching.

After the recesses R are formed, oxide may be formed on sidewalls S and bottom surfaces B of the recesses R. The oxide is a by-product of the etching for forming the recesses R and has a thickness lower than about 15 Å. The oxide on at least the sidewalls S of the recesses R is removed or cleaned physically. In some embodiments, the oxide on the sidewalls S of the recesses R is removed using spattering with an inert gas, such as argon spattering. In some embodiments, the oxide on the bottom surfaces B of the recesses R is also removed or cleaned by the spattering.

Figure 10:
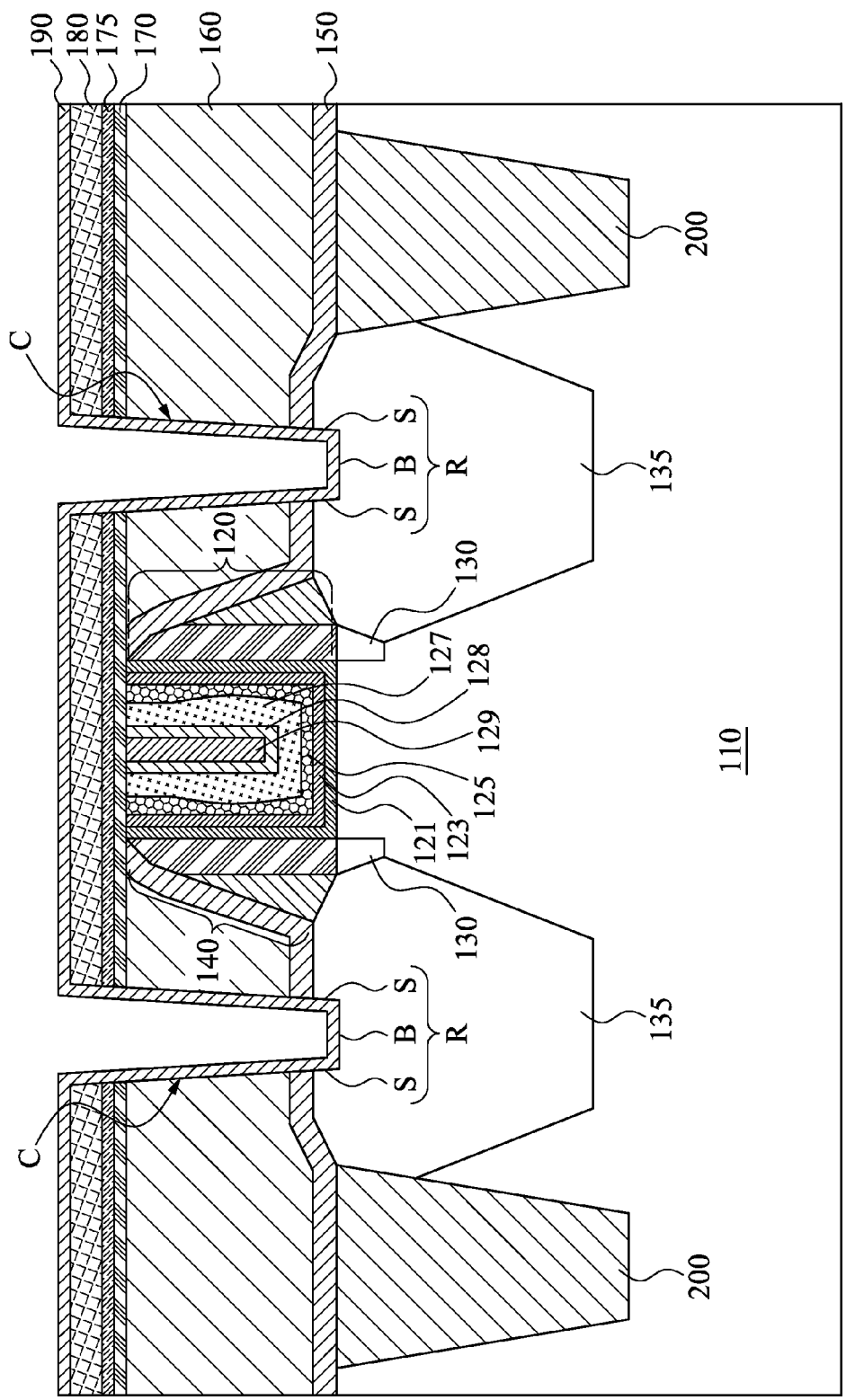

Reference is made to FIG. 10. A dielectric spacer liner (DSL) layer 190 is conformally formed on the protective layer 180, sidewalls of the contact holes C, and the sidewalls S and the bottom surfaces B of the recesses R in accordance with some embodiments. The DSL layer 190 is configured to protect the sidewalls of the contact holes C from being damaged by the subsequent pre-amorphized implantation (PAI) process. The DSL layer 190 is made of, for example, silicon oxycarbide (SiOC), silicon oxynitride (SiON), silicon dioxide ($SiO_2$), silicon nitride (SiN), other suitable materials, or combinations thereof. The DSL layer 190 is formed by, for example, atomic layer deposition (ALD) or other suitable processes.

In some embodiments, the dielectric spacer liner (DSL) layer 190 is a conformally deposited layer. The term "conformally deposited layer" denotes a layer having a thickness that does not deviate from greater than or less than 20% of an average value for the thickness of the layer.

Since the oxide on the sidewalls S of the recesses R is removed or cleaned physically, the dielectric spacer liner (DSL) layer 190 can be formed on the sidewalls S of the recesses R. The DSL layer 190 on the sidewalls S of the recesses R is configured to prevent an etchant used in the subsequent process from getting through the DSL layer 190, the source/drain regions 135, the gate spacers 140, and/or the semiconductor substrate 110 to damage the gate stack 120.

Figure 11:
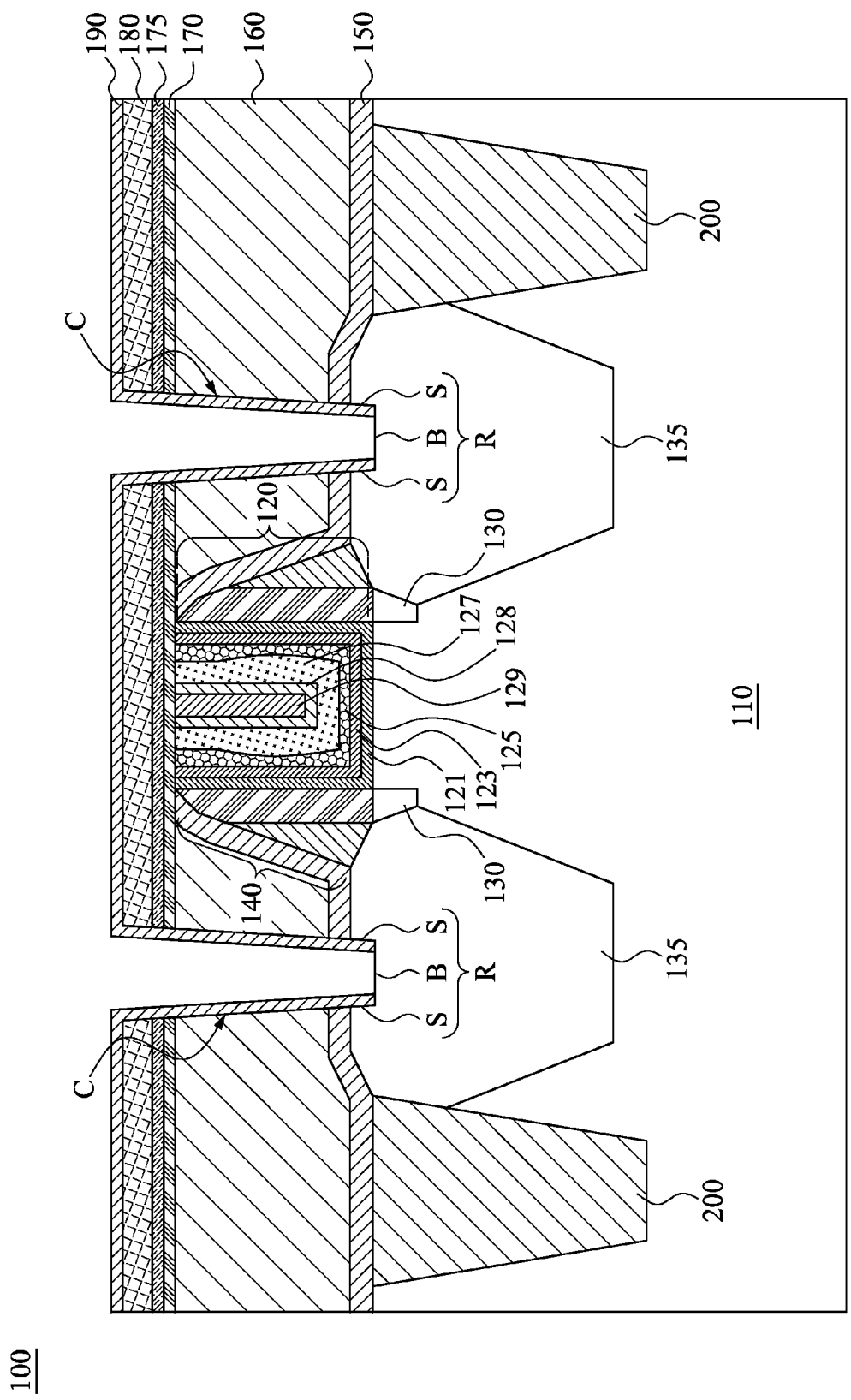

Reference is made to FIG. 11. An etching process is performed to remove the dielectric spacer liner (DSL) layer 190 on the bottom surfaces B of the recesses R so as to expose portions of the source/drain regions 135. The etching process includes, for example, an argon plasma etching process.

Afterwards, a cleaning process may be performed to clean the residues from the etching process of the dielectric spacer liner (DSL) layer 190 on the bottom surfaces B of the recesses R. The cleaning process includes, for example, an ammonia hydroxide-hydrogen peroxide-water mixture (APM) cleaning process using a cleaning solution containing $NH_4OH$, $H_2O_2$, and $H_2O$.

A pre-amorphized implantation (PAI) process may be performed to reduce the dopant channeling effect and enhance dopant activation. In some embodiments, silicon, germanium, or carbon is used. In alternative embodiments, inert gases, such as neon, argon, krypton, xenon, and/or radon, are used. The PAI process prevents subsequently doped impurities from channeling through spaces within the crystal lattice structure and reaching depths greater than desired. Portions of the source/drain regions 135 exposed and located at the bottom surfaces B of the recesses R are turned into an amorphous state as a result of the PAI process.

Figure 12:
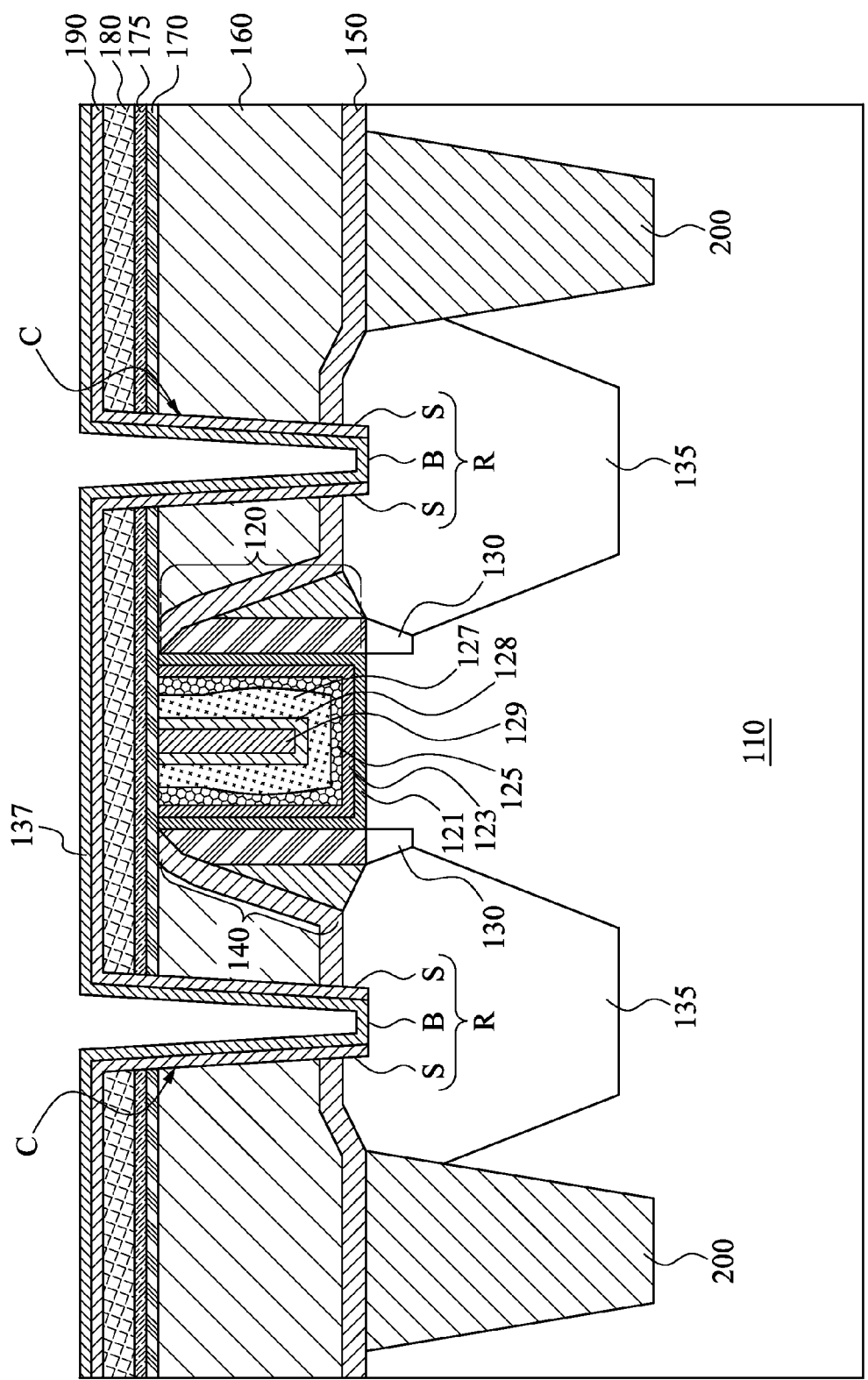

Reference is made to FIG. 12. A metal containing material 137 is formed on the recesses R. The metal containing material 137 may be deposited on the dielectric spacer liner (DSL) layer 190 and the bottom surfaces B of the recesses R. In some embodiments, the metal containing material 137 is a conformally deposited layer. In alternative embodiments, the metal containing material 137 fills the recesses R.

The metal containing material 137 may be deposited using physical vapor deposition (PVD) or chemical vapor deposition (CVD). Examples of PVD that are suitable for forming the metal containing material 137 include sputtering and plating. In some embodiments, the metal containing material 137 may include nickel or nickel platinum alloy. In alternative embodiments, the metal containing material 137 may include cobalt, (Co), tungsten (W), titanium (Ti), tantalum (Ta), aluminum (Al), platinum (Pt), ytterbium (Yb), molybdenum (Mo), erbium (Er), or combinations thereof. The metal containing material 137 may have a thickness in a range from about 5 nm to about 20 nm. In alternative embodiments, the metal containing material 137 may have a thickness in a range from about 6 nm to about 15 nm.

Figure 13:
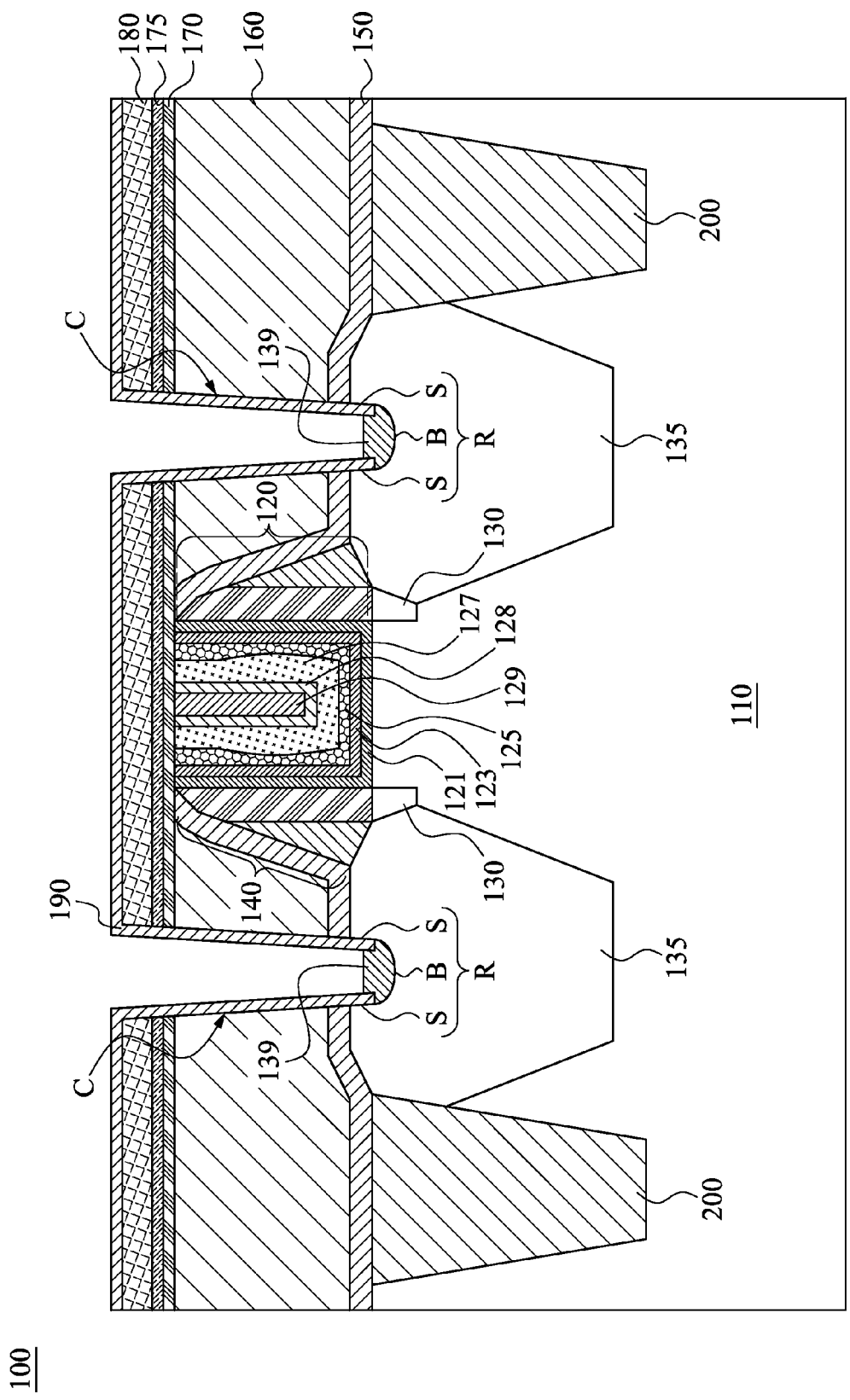

Reference is made to FIG. 13. Following deposition of the metal containing material 137, the structure is subjected to an annealing step including, but not limited to, rapid thermal annealing (RTA). During the annealing step, the deposited metal containing material 137 reacts with portions of the source/drain regions 135 adjacent to the recesses R forming metal semiconductor alloy contacts 139, such as a metal silicide. In some embodiments, the annealing step is performed at a temperature ranging from about 350° C. to about 600° C. for a time period ranging from about 1 second to about 90 seconds.

Following the annealing step, the remaining metal containing material 137 that is not converted to the metal semiconductor alloy contacts 139 (referred to as non-reacted metal containing material hereinafter) is removed. The non-reacted metal containing material may be removed by an etching process that is selective to the metal semiconductor alloy contacts 139. The etching process may include wet etching, dry etching, or combinations thereof. In some embodiments, the non-reacted metal containing material is removed by wet etching. An etchant, such as hot phosphoric acid, is chosen to remove the non-reacted metal containing material.

Since the dielectric spacer liner (DSL) layer 190 is formed on the sidewalls S of the recesses R, and the DSL layer 190 is made of a material which can prevent the etchant used in the wet etching of the non-reacted metal containing material from getting through. Therefore, the etchant is blocked from getting through the DSL layer 190, the source/drain regions 135, the gate spacers 140, and/or the semiconductor substrate 110 to damage the gate stack 120.

Figure 14:
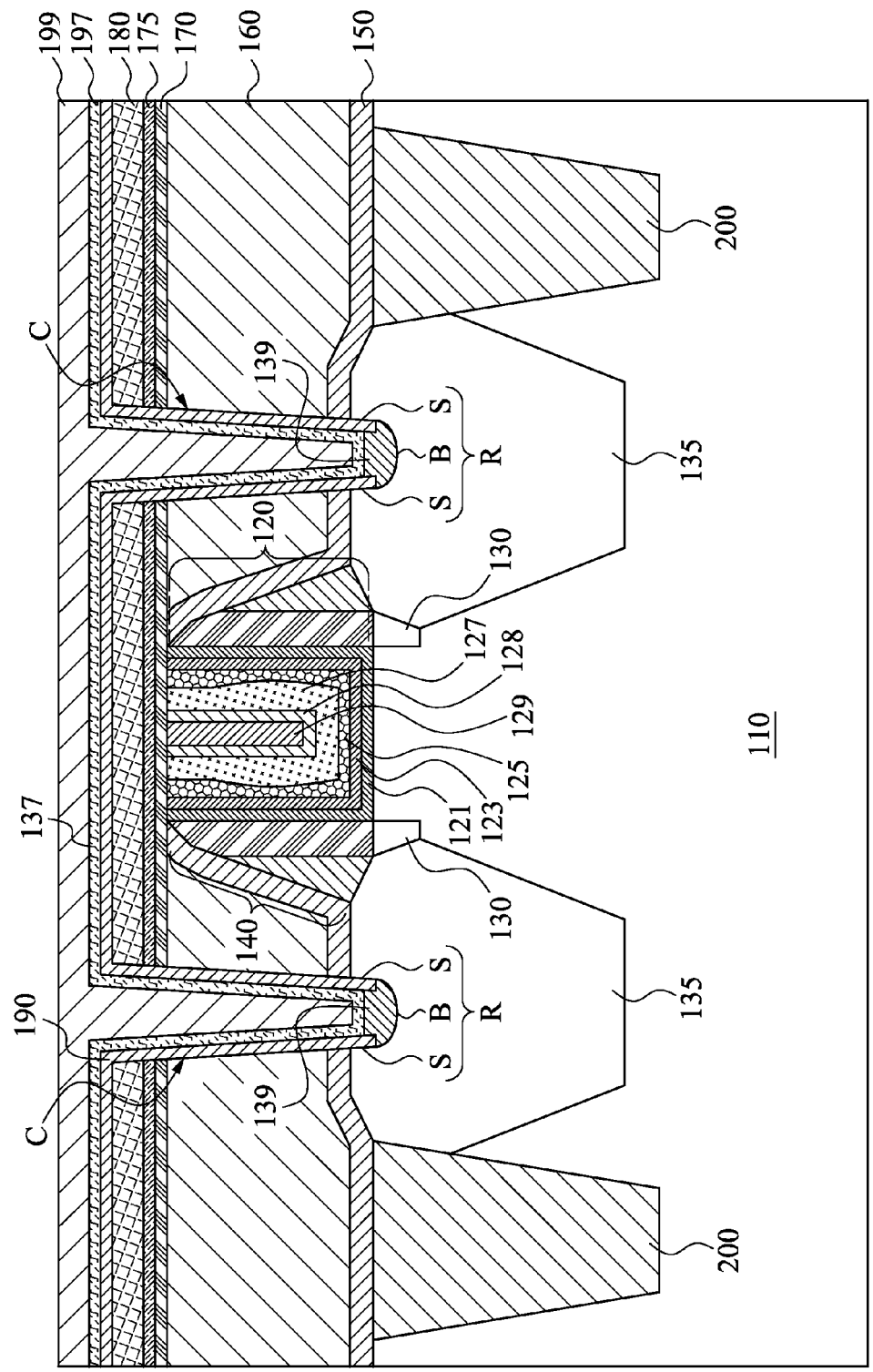

Reference is made of FIG. 14. A barrier layer 197 is formed on the dielectric spacer liner (DSL) layer 190 and the metal semiconductor alloy contacts 139. The barrier layer 197 is made of a material which can adhere a conductor in the contact hole C to the DSL layer 190 and stop diffusion of the conductor into the DSL layer 190. In some embodiments, when the conductor in the contact hole C is made of tungsten (W), the barrier layer 197 is made of, for example, titanium nitride (TiN), titanium (Ti)/TiN, Ti, or other transition metal based materials, or combinations thereof. The barrier layer 197 is formed by, for example, physical vapor deposition (PVD), ionized physical vapor deposition (IPVD), atomic layer deposition (ALD), chemical vapor deposition (CVD), or combinations thereof.

A conductor 199 overfills the contact holes C. The conductor 199 is made of metal, such as tungsten (W) or other suitable conductive materials. The conductor 199 is form by, for example, electrochemical deposition, physical vapor deposition (PVD), chemical vapor deposition (CVD), or combinations thereof.

Figure 15:
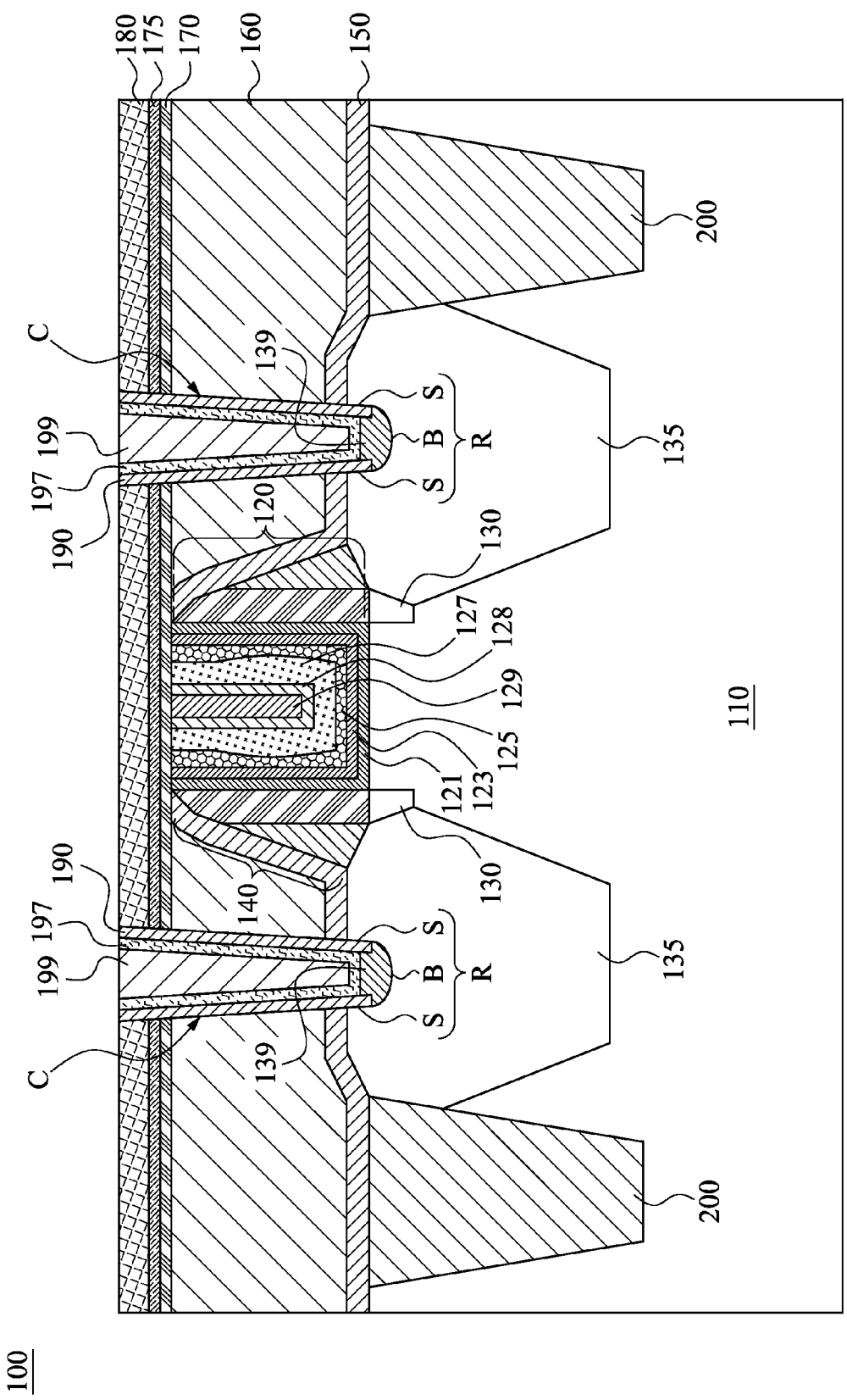

FIG. 15 illustrates a planarization step, which is performed using, for example, chemical mechanical polish (CMP). The CMP is performed to remove the conductor 199, the barrier layer 197, and the DSL layer 190 outside the contact holes C and over the top surface of the protective layer 180. After the CMP, the conductor 199 and the barrier layer 197 remaining in the contact holes C forms contact plugs electrically connected to the metal semiconductor alloy contacts 139 and the source/drain regions 135.

It is understood that for the embodiments shown above, additional processes may be performed to complete the fabrication of a semiconductor device. For example, these additional processes may include formation of interconnect structures (e.g., lines and vias, metal layers, and interlayer dielectric that provide electrical interconnection to the semiconductor device), formation of passivation layers, and packaging of the semiconductor device.

Embodiments of semiconductor devices described above remove oxide on the sidewalls S of the recesses R before formation of the dielectric spacer liner (DSL) layer 190. Therefore, the DSL layer 190 can be formed on the sidewalls S of the recesses R. The DSL layer 190 may be made of a material which can prevent an etchant used in the subsequent wet etching of the non-reacted metal containing material from getting through. Therefore, during the wet etching of the non-reacted metal containing material, the etchant is blocked from getting through the DSL layer 190, the source/drain regions 135, the gate spacers 140, and/or the semiconductor substrate 110 to damage the gate stack 120.

In accordance with some embodiments of the present disclosure, a semiconductor structure includes a semiconductor substrate, at least one dielectric layer, a dielectric spacer liner (DSL) layer, and at least one conductor. The dielectric layer is present on the semiconductor substrate. The dielectric layer has at least one contact hole exposing at least a portion of the semiconductor substrate. The semiconductor substrate has at least one recess communicating with the contact hole. The recess has a bottom surface and at least one sidewall. The DSL layer is present on at least the sidewall of the recess. The conductor is present at least partially in the contact hole and is electrically connected to the semiconductor substrate.

In accordance with alternative embodiments of the present disclosure, a method for manufacturing a semiconductor structure includes forming at least one dielectric layer on a semiconductor substrate. At least one contact hole is formed in the dielectric layer to expose at least a portion of the semiconductor substrate. At least one recess is formed in the semiconductor substrate, in which the recess communicates with the contact hole, and the recess has a bottom surface and at least one sidewall. At least one dielectric spacer liner (DSL) layer is formed on at least the sidewall of the recess. At least one conductor is formed at least partially in the contact hole, in which the conductor is electrically connected to the semiconductor substrate.

In accordance with yet alternative embodiments of the present disclosure, a method for manufacturing a semiconductor structure includes forming at least one source/drain region in a semiconductor substrate. At least one dielectric layer is formed on at least the source/drain region. At least one contact hole is formed in the dielectric layer to expose at least a portion of the source/drain region, in which the forming the contact hole further forms at least one recess in the source/drain region, and the recess has a bottom surface and at least one sidewall. At least the sidewall of the recess is physically cleaned. At least one dielectric spacer liner (DSL) layer is formed on the dielectric layer, the contact hole, and the recess. The DSL layer on the bottom surface of the recess is removed. At least one conductor is formed in the contact hole, in which the conductor is electrically connected to the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a semiconductor substrate;
    at least one dielectric layer present on the semiconductor substrate, the dielectric layer having at least one contact hole, wherein the semiconductor substrate has at least one recess communicating with the contact hole, and the recess has a bottom surface and at least one sidewall;
    a dielectric spacer liner (DSL) layer present on at least the sidewall of the recess, wherein the DSL layer has an opening that enables communication to the recess in the semiconductor substrate; and
    at least one conductor present at least partially in the contact hole and electrically connected to the semiconductor substrate through the opening in the DSL layer.

2. The semiconductor structure of claim 1, further comprising:
    at least one metal semiconductor alloy contact present in the recess, wherein the at least one conductor is electrically connected to the semiconductor substrate through the metal semiconductor alloy contact.

3. The semiconductor structure of claim 2, wherein the DSL layer is made of a material which prevents an etchant used in formation of the metal semiconductor alloy contact from getting through.

4. The semiconductor structure of claim 1, wherein the DSL layer is made of silicon oxycarbide (SiOC), silicon oxynitride (SiON), silicon dioxide ($SiO_2$), silicon nitride (SiN), or combinations thereof.

5. The semiconductor structure of claim 1, wherein the DSL layer is further present on at least one sidewall of the contact hole.

6. The semiconductor structure of claim 1,
    wherein the semiconductor substrate has a stressor at least partially therein, and the recess is in the stressor.

7. A method for manufacturing a semiconductor structure, the method comprising:
    forming at least one dielectric layer on a semiconductor substrate;
    forming at least one contact hole in the dielectric layer;
    forming at least one recess in the semiconductor substrate, wherein the recess communicates with the contact hole, and the recess has a bottom surface and at least one sidewall;
    forming at least one dielectric spacer liner (DSL) layer on at least the sidewall and the bottom surface of the recess;
    removing a portion of the DSL layer on the bottom surface of the recess to expose a portion of the semiconductor substrate; and
    forming at least one conductor at least partially in the contact hole, wherein the at least one conductor is electrically connected to the exposed portion of the semiconductor substrate.

8. The method of claim 7, further comprising:
    removing oxide on at least the sidewall of the recess before the forming the DSL layer.

9. The method of claim 8, wherein the oxide is removed physically.

10. The method of claim 8, wherein the oxide is removed by spattering with an inert gas.

11. The method of claim 8, wherein the oxide is removed by argon spattering.

12. The method of claim 7, further comprising:
    forming a metal containing material in at least the recess;
    converting a first portion of the metal containing material and the portion of the semiconductor substrate into a metal semiconductor alloy contact; and
    removing a second portion of the metal containing material that is not converted to the metal semiconductor alloy contact.

13. The method of claim 12, wherein the DSL layer is made of a material which prevents an etchant used in the removing the second portion of the metal containing material from passing through the DSL layer.

14. The method of claim 7, wherein the DSL layer is made of silicon oxycarbide (SiOC), silicon oxynitride (SiON), silicon dioxide ($SiO_2$), silicon nitride (SiN), or combinations thereof.

15. The method of claim 7, wherein the forming the DSL layer further forms the DSL layer on at least one sidewall of the contact hole.

* * * * *